(12) United States Patent
Eo et al.

(10) Patent No.: US 9,641,124 B2
(45) Date of Patent: May 2, 2017

(54) ELECTRIC INTERCONNECTION SYSTEM FOR SOLAR CELL OF VEHICLE ROOF

(71) Applicant: Hyundai Motor Company, Seoul (KR)

(72) Inventors: Moon Jung Eo, Seoul (KR); Won Jung Kim, Seoul (KR); Hoo Sang Park, Hwaseong-si (KR); Sang Hak Kim, Seoul (KR); Sol Kim, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/918,087

(22) Filed: Oct. 20, 2015

(65) Prior Publication Data

US 2016/0126886 A1    May 5, 2016

(30) Foreign Application Priority Data

Nov. 4, 2014 (KR) .................. 10-2014-0152067

(51) Int. Cl.
| | |
|---|---|
| *B60J 7/047* | (2006.01) |
| *H02S 20/30* | (2014.01) |
| *B60J 7/04* | (2006.01) |
| *B60K 16/00* | (2006.01) |

(52) U.S. Cl.
CPC ............. *H02S 20/30* (2014.12); *B60J 7/04* (2013.01); *B60K 16/00* (2013.01); *B60K 2016/003* (2013.01)

(58) Field of Classification Search
CPC ..................................... H02S 20/30
USPC .................... 296/216.01–224, 211
See application file for complete search history.

(56) References Cited

U.S. PATENT DOCUMENTS

| | | | | |
|---|---|---|---|---|
| 2,901,723 A | * | 8/1959 | Kolb ................. | H01R 4/64 174/75 B |
| 5,261,722 A | | 11/1993 | Staley et al. | |
| 6,155,635 A | * | 12/2000 | Wecker ............. | B60J 7/003 296/211 |
| 6,485,090 B1 | * | 11/2002 | Patz ................. | B60J 7/003 296/211 |
| 6,677,527 B2 | * | 1/2004 | Brannmark ....... | H01R 11/01 148/432 |
| 8,348,336 B2 | * | 1/2013 | De Bie ............. | B60J 7/0084 136/291 |

(Continued)

FOREIGN PATENT DOCUMENTS

| | | |
|---|---|---|
| JP | 5-89050 U | 12/1993 |
| JP | 6-87330 A | 3/1994 |
| JP | 6-63419 U | 9/1994 |

(Continued)

*Primary Examiner* — Dennis H Pedder
(74) *Attorney, Agent, or Firm* — McDermott Will & Emery LLP (57) ABSTRACT

An electric interconnection system in a vehicle includes a fixed part of the vehicle and a movable part of the vehicle. The movable part has a solar cell module mounted thereon and includes at least one component that maintains contact with the fixed part when the moving part moves. One or more first electric wires extend from the solar cell module of the movable part. Each of the one or more first electric wires has an end that is fixed to one of the at least one component of the movable part. One or more second electric wires are installed on the fixed part. The one or more second electric wires maintain contact with the ends of the first electric wires when the movable part moves.

13 Claims, 7 Drawing Sheets

(56) References Cited

U.S. PATENT DOCUMENTS 9,057,513 B2 * 6/2015 Lindblom ............... F21V 21/34

FOREIGN PATENT DOCUMENTS

| | | |
|---|---|---|
| JP | 6-83434 U | 11/1994 |
| JP | 2001-130349 A | 5/2001 |
| JP | 2006-510518 A | 3/2006 |
| JP | 2012-094817 A | 5/2012 |
| KR | 1999-013727 U | 4/1999 |
| KR | 10-1417524 B1 | 7/2014 |
| KR | 10-1428215 B1 | 8/2014 |
| KR | 10-2014-0126854 A | 11/2014 |

* cited by examiner

ELECTRIC INTERCONNECTION SYSTEM FOR SOLAR CELL OF VEHICLE ROOF

CROSS-REFERENCE TO RELATED APPLICATION

This application claims under 35 U.S.C. §119(a) the benefit of priority to Korean Patent Application No. 10-2014-0152067 filed on Nov. 4, 2014, the entire contents of which are incorporated herein by reference.

TECHNICAL FIELD

The present disclosure relates to an electric interconnection system for a solar cell of a vehicle roof. More particularly, it relates to an electric interconnection system that can constantly electrically connect a solar cell of a movable part for opening/closing a roof to a fixed part of a vehicle in a vehicle roof.

BACKGROUND

In recent years, a technology has been developed, which can use power produced by a solar cell by mounting a solar cell on the top or a sun roof of a vehicle body roof panel or a tempered glass of a panorama roof in an internal combustion engine vehicle or in vehicles such as a hybrid electric vehicle (HEV), an electric vehicle (EV), and a fuel cell electric vehicle (FCEV).

For example, the solar cell has been variously developed as an environment-friendly energy source in that when a room temperature rises during parking for the summer season, g an in-vehicle temperature is lowered by driving a fan with power generated by the solar cell and fuel efficiency is improved by using an air conditioner powered by the solar cell.

This is a simple example using the solar cell and in the vehicle, the generated power of the solar cell may be supplied to various apparatuses including a battery in a vehicle. Therefore, the solar cell can be widely used as an auxiliary power source in addition to the existing power source (a battery or a fuel cell) mounted on the vehicle.

Sunlight can be most stably received in a wide area in a sun roof or a panorama roof among locations of the vehicle on which the solar cell can be mounted. Research has shown that it is beneficial that the solar cell be applied to a roof glass of the sun roof and the panorama roof.

Prior art documents associated therewith may include Korean Patent Registration No. 1428215 (Aug. 1, 2014) and Korean Patent Registration No. 10-1417524 (Jul. 1, 2014).

However, when the solar cell is applied to the sun roof or the panorama roof that moves for an opening/closing operation in the vehicle body, the solar cell bonded to the roof glass also moves together depending on opening/closing of the roof.

As a result, in order to secure normal power from the solar cell, the solar cell bonded to a movable part (moving glass, that is, a moved and opened/closed part of the roof) and the solar cell bonded to a fixed part (fixed glass) need to be connected with each other, requiring an electric interconnection technology that can electrically connect the solar cell of the movable part and the solar cell of the fixed part.

In particular, since the solar cell including electric interconnection is not known to have been applied to the movable part of the panorama roof in the related art, a new electric interconnection structure is required. When the solar cell is applied to the movable part, (+) and (−) side electric cables of the solar cell move together with the movable part (including the solar cell) as the roof is opened, and as a result, it is difficult to continuously connect the solar cell.

Therefore, a system is required, which can secure a structure which is continuously electrically connected regardless of the movement of the electric cables depending on opening/closing of the roof.

The above information disclosed in this Background section is only for enhancement of understanding of the background of the invention and therefore it may include information that does not form the prior art that is already known in this country to a person of ordinary skill in the art

SUMMARY

The present disclosure has been made in an effort to solve the above-described problems associated with prior art and to provide an electric interconnection system that can constantly electrically connect a solar cell connected to a movable part (moving glass) to a fixed part of a vehicle in order to secure normal power from the solar cell.

In particular, the present disclosure has also been made an in effort to provide an electric interconnection structure and an electric interconnection technique that can stably secure power generated from a solar cell mounted on a movable part of a panorama roof regardless of opening/closing a roof.

In one aspect, an electric interconnection system in a vehicle includes a fixed part of the vehicle and a movable part of the vehicle. The movable part has a solar cell module mounted thereon and includes at least one component that maintains contact with the fixed part when the moving part moves. One or more first electric wires extend from the solar cell module of the movable part. Each of the one or more first electric wires has an end that is fixed to one of the at least one component of the movable part. One or more second electric wires are installed on the fixed part. The one or more second electric wires maintain contact with the ends of the first electric wires when the movable part moves.

In certain embodiments, the the movable part may be a part of a vehicle roof and may be configured to open and close the roof.

In certain embodiments, the vehicle roof may be a panorama roof in which the solar cell module is bonded to a roof glass.

In certain embodiments, when the vehicle roof is opened, the solar cell module mounted on the movable part may be adjacent the roof glass of the fixed part which overlaps with the movable part. In certain embodiments, a second solar cell module may be mounted on the fixed part.

In certain embodiments, the solar cell module may be bonded to the inside of the roof glass.

In certain embodiments, the at least one component of the movable part may be at least one tilt lever that is configured to tilt when the movable part moves, the fixed part may be at least one guide rail slidingly joined with the at least one tilt lever. In certain embodiments, each tilt lever may have one end rotatably joined to the movable part and another end inserted into the guide rail, the other end having a contact slide member disposed thereon and configured to be guided along the guide rail, and one of the ends of the first electric wires may be fixed to the contact slide member.

In certain embodiments, the ends of the first electric wires may be buried in the contact slide member and a conductive material may be attached to, coated on, or buried in a buried portion of the ends of the first electric wires to form a contact terminal that is configured to connect to the second electric wires of the guide rail.

In certain embodiments, the second electric wires may be formed by attaching, coating, or burying a conductive material along the guide rail.

In certain embodiments, the electric wires of the fixed part may be fabricated by a tape, a film, an electric cable, and paste and may be formed by attaching, coating, or burying a conductive material along the fixed part.

In certain embodiments, the conductive metal may include at least one of the following: metal such as iron (Fe), gold (Au), silver (Ag), aluminum (Al), copper (Cu), tin (Sn), or platinum (Pt), conductive polymers such as polyaniline, polypyrrole, polythiopene, polyacetylene, or PEDOT(poly (3,4-ethylenedioxythiophene))-PSS(polystyrene sulfonate), carbon series conductive materials such as carbon nano tube (CNT), graphene, or carbon black, and one kind or two kinds or more of oxide series compounds such as ITO, FTO, ZnO, and AZO In certain embodiments, a rail cover made of an electric insulating material may be attached to the second electric wires and a portion of the second electric wires may be exposed on the surface of the rail cover so that the ends of the first electric wires are electrically connected to the second electric wires.

In certain embodiments, the one or more first electric wires may include one (+) side electric wire and one (−) side electric wire that may each be fixed to one of the at least one tilt lever and are each positioned at one of left and right sides of the vehicle. The one or more guide rails may include left and right guide rails at left and right sides of the vehicle, respectively, wherein each tilt lever is slidingly joined with one of the left and right guide rails.

In certain embodiments, the one or more first electric wires may include a (+) side electric wire and a (−) side electric wire that extend to one of the at least one tilt lever. The one or more second electric wires may include a (+) side electric wire and a (−) side electric wire installed on one of the at least one guide rail, and the ends of the a (+) side electric wire and a (−) side electric wire of the first electric wires are respectively connected with the (+) side electric wire and the (−) side electric wire of the second electric wires installed in the one of the at least one guide rail.

In certain embodiments, the one or more second electric wires may be connected to the solar cell module installed on the roof glass of the fixed part through a separate electric wire or connected to an in-vehicle battery or an in-vehicle apparatus requiring power of the solar cell through a separate electric wire.

As a result, according to an electric interconnection system for a solar cell of a vehicle roof according to embodiments of the present invention, a solar cell applied to a movable part through a guide rail fixedly installed in a roof frame and a tilt lever that maintains a normal contact state with the guide rail while moving on the guide rail can be normally connected with a fixed part of a vehicle regardless of the movement.

Therefore, in certain embodiments, the solar cell can be applied to the movable part as well as the fixed part of the vehicle roof, and as a result, a solar cell application portion can be enlarged to maximize solar cell utilization in the vehicle and power of the solar cell can be variously used in the vehicle to contribute to improve a driving distance of and fuel efficiency of the vehicle.

Other aspects and embodiments of the invention are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (for example, fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein.

movable part It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While embodiments of the invention will be described below, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, exemplary embodiments of the present invention will be described in detail with reference to the accompanying drawings, so as to be easily implemented by those skilled in the art.

Figure 1:
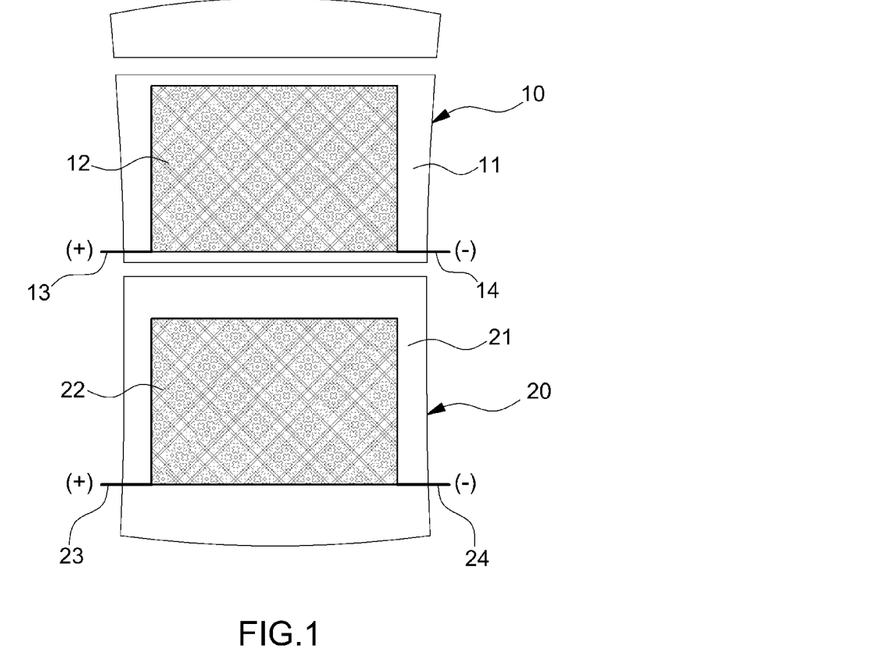
FIGS. 1 and 2 are schematic views of a panorama roof of a vehicle adopting a solar cell.
Figure 2:
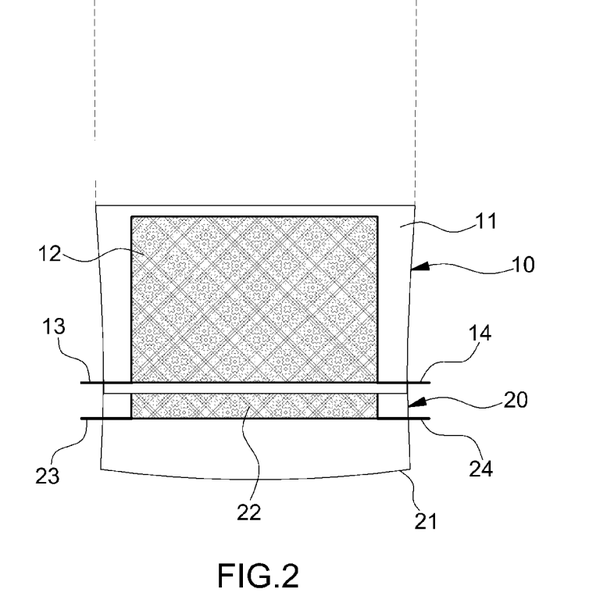

FIGS. 1 and 2 are schematic views of a panorama roof of a vehicle including a solar cell. In certain embodiments, the solar cell is applied to both a movable part 10 and a fixed part 20 of the panorama roof.

FIG. 1 is a plan view illustrating a closed state of the panorama roof. FIG. 2 is a plan view illustrating an opened state of the panorama roof.

In the present embodiment, the solar cell is configured in a module form in which a plurality of solar cell panels are connected in series or in parallel, which may be mounted on the movable part 10 and the fixed part 20. Thus, each solar panel is often hereinafter referred to as 'solar cell module.'

In this embodiment, the solar cell panels may be bonded to the inside of roof glasses 11 and 21 (a movable glass and a fixed glass) in each part of the panorama roof in order to prevent the solar cell and an electric interconnection structure thereof from being exposed to the outside in terms of an exterior of a vehicle.

Hereinafter, in the present specification, a configuration in which a solar cell module 12 (at least one of a plurality of solar cell panels) is bonded to a roof part that moves at the time of opening/closing the panorama roof, that is, the movable roof glass 11 (movable glass) will be referred to as the movable part 10 and a configuration in which a solar cell module 22 is bonded to a fixed roof part, that is, the fixed roof glass 21 (fixed glass) will be referred to as the fixed part 20. It should be noted that in other embodiments, movable part 10 and the fixed part 20 may be other parts in the vehicle, not necessarily roof panels, and not necessarily made of glass. Embodiments may include any movable part of the vehicle that is configured to move relative to a fixed part and that has a solar panel mounted thereon.

However, in certain embodiments, the fixed part 20 includes the roof part of the configuration in which the solar cell module 22 is bonded to the roof glass 21. In certain embodiments, the fixed part may include all fixed components at a vehicle side such as a roof frame (represented by reference numeral 40 in FIG. 6) and a guide rail (represented by reference numeral 41 in FIG. 6) to be described below.

In certain embodiments, when the panorama roof is opened, the movable part 10 is slightly lifted upwards of the vehicle and thereafter, moves upwards of the fixed part 20 (in this embodiment, the fixed glass part to which the solar cell module is bonded) to overlap with the fixed part 20 and when the movable part 10 moves, a tilt lever (represented by reference numeral 30 in FIG. 6) joined to the movable part is guided on the guide rail (fixed component) of the roof frame as described below.

The guide rail, which, in certain embodiments, is fixedly installed to the roof frame 40 positioned at both left and right ends of the vehicle, is deployed lengthily in an anteroposterior direction of a vehicle body at both left and right ends of the fixed part 20, and serves to guide the tilt lever when the movable part 10 moves.

In the present embodiment, electric wires are formed at locations in both components that normally contact each other between the movable part 10 and the vehicle-side fixed part 20, respectively and normal electric connection is achieved through the contact between both electric wires.

First electric wires 13 and 14, and other electric wires 23, and 24 for outputting power generated through power generation to the outside are installed in the respective solar cell modules 12 and 22 installed in the movable part 10 and the fixed part 20 of the panorama roof.

FIG. 1 illustrates that the first electric wires 13 and 14 that extend from the solar cell module 12 of the movable part 10 continuously move when the panorama roof is opened/closed, that is, when the movable part 10 moves.

In this case, the first electric wires 13 and 14 that extend from the solar cell module 12 of the movable part 10 are connected to be electrically normally connected to the solar cell module 22 installed in the fixed part 20 through the electric interconnection system of the present invention.

Alternatively, the first electric wires 13 and 14 that extend from the solar cell module 12 of the movable part 10 may be connected to an apparatus (not illustrated) using power of the solar cell or a battery (not illustrated) charged with the power of the solar cell in the vehicle through the electric interconnection system of the present invention.

The other electric wires 23 and 24 that extend from the solar cell module 22 of the fixed part 20 are connected to the apparatus using the power of the solar cell or the battery charged with the power of the solar cell in the vehicle.

In certain embodiments, the first electric wires 13 and 14 for outputting the power to the outside, which extend from the solar cell module 12 of the movable part 10 may become a plated electric cable up to the tilt lever as described below and the electric wires 23 and 24 connected to supply power to the solar cell module 22 of the fixed part 20 or an in-vehicle apparatus (including the battery) from the guide rail to be described below may also be the electric cable.

Referring to FIG. 2, when the panorama roof is opened, the movable part 10 including the solar cell module 12 and the roof glass 11 also moves to overlap with the fixed part 20 including the solar cell module 22 and the roof glass 21 by a driving device (not illustrated).

In certain embodiments, when the panorama roof is opened, the movable part 10 moves upward at a predetermined angle and thereafter, moves upwards of the fixed part 20 by the driving device while being supported by the tilt lever to be described below.

Referring to FIG. 2, an example in which the movable part 10 moves upwards to overlap with the fixed part 20 to open the panorama roof is illustrated.

While the panorama roof is opened as described above, that is, while the movable part 10 moves up and moves, the solar cell module 12 of the movable part 10 needs to normally electrically connected to the fixed part 20.

That is, regardless of the opening/closing movement and the position of the movable part 10, the electric wires 13 and 14 for the outside output in the movable part 10 need to be continuously electrically connected to the solar cell module 22 of the fixed part 20.

To this end, in the present embodiment, the first electric wires 13 and 14 extend to the tilt lever from the solar cell module 12 of the movable part 10 and the first electric wires 13 and 14 of the tilt lever that moves together with the movable part 10 maintain a normal connection state with electric wires at the vehicle roof side, that is, electric wires of the guide rail to be described below.

One or more second electric wires at the vehicle roof side which maintain the normal connection state with the electric wires of the tilt lever as electric wires fixed to a fixed part location (in certain embodiments, the location of the guide rail to be described below) of the panorama roof are electrically connected with the solar cell module 22 of the fixed part 20 or the in-vehicle apparatus or the battery through separate electric wires.

Figure 3A:
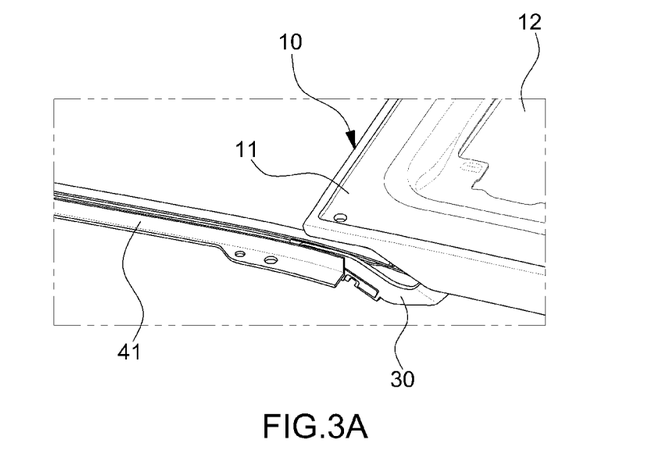
FIGS. 3A to 3C are perspective views illustrating a state in which a movable part of the panorama roof moves up and thereafter, moves.
Figure 3B:
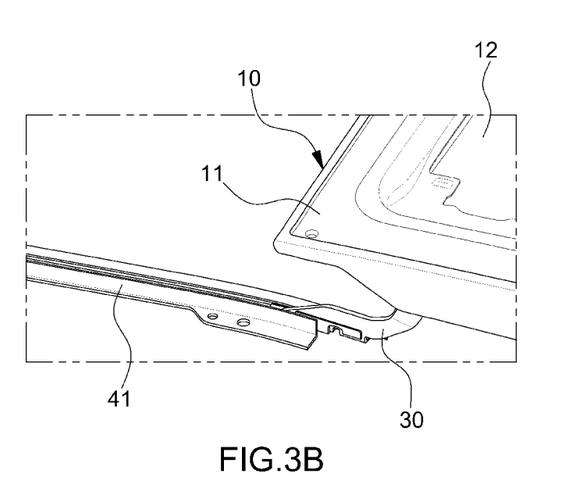
Figure 3C:
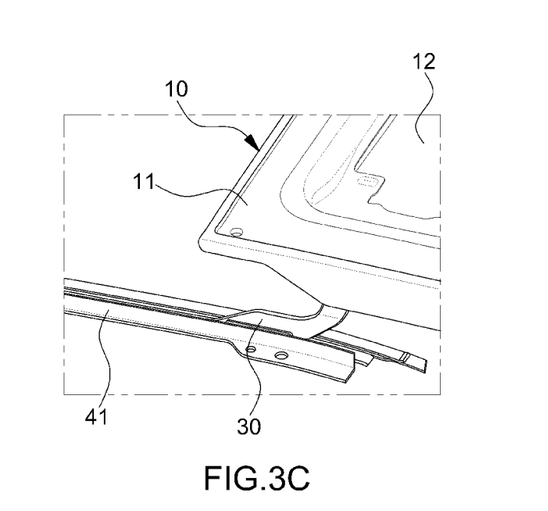

FIGS. 3A to 3C are perspective views illustrating a state in which the movable part 10 of the panorama roof moves up and thereafter, moves. FIG. 3A illustrates a state in which the panorama roof is completed closed, and FIGS. 3B and 3C illustrate a state in which the movable part 10 moves in a direction in which the panorama roof is opened.

In FIGS. 3A to 3C, a guide rail 41 is fixedly installed in the roof frame (represented by reference numeral 40 in FIG. 6) deployed at both left and right ends of the vehicle roof and since the movable part 10 moves upwards of the vehicle and thereafter, moves upwards of the fixed part 20, an upward direction in the figure indicates a vehicle outside direction and a downward direction in the figure indicates a vehicle inside direction.

As illustrated in the figures, in certain embodiments, one end of the tilt lever 30 is hinge-joined to both left and right ends of the movable part 10 of the panorama roof and in this case, the other end of the tilt lever 30 is inserted into the guide rail 41 installed at the vehicle roof side, more accurately, the fixed part 20 side.

In certain embodiments, the tilt lever 30 as a member that is joined to the movable part 10, tilts when the movable part 10 moves up for movement, and is guided on the guide rail 41, serves to hold the movable part 10 to move along a set movement trajectory.

In certain embodiments, the guide rail 41 as a member that is installed at both left and right ends lengthily in the anteroposterior direction of the vehicle body is configured to guide the other end of the tilt lever 30 with being inserted into the inside of the guide rail 41 when the panorama is opened/closed, that is, when the movable part 10 moves.

In certain embodiments, a contact slide member (represented by reference numeral 31 in FIGS. 5 and 6) is installed at the other end of the tilt lever 30 and the contact slide member 31 is inserted into the inside of the guide rail 41 to be guided with contacting the guide rail and regardless of the movement (the opening/closing operation of the panorama roof) of the movable part 10 and the location thereof, the contact slide member of the tilt lever 30 becomes a part that maintains the normal contact state with the guide rail 41.

In certain embodiments, while the contact slide member 31 is joined to the inside of the guide rail 41, the movable part 10 vertically moves for opening/closing the roof (the movable part joined with the tilt lever moves up or down), one end of the tilt lever 30 relatively rotates with respect to the movable part 10 and the other end of the tilt lever 30 also relatively rotates with respect to the contact slide member.

In certain embodiments, the tilt lever 30 is normally joined with the movable part 10 through a hinge joining portion and the contact slide member maintains the normal contact state with the guide rail 41 as described above.

Figure 4:
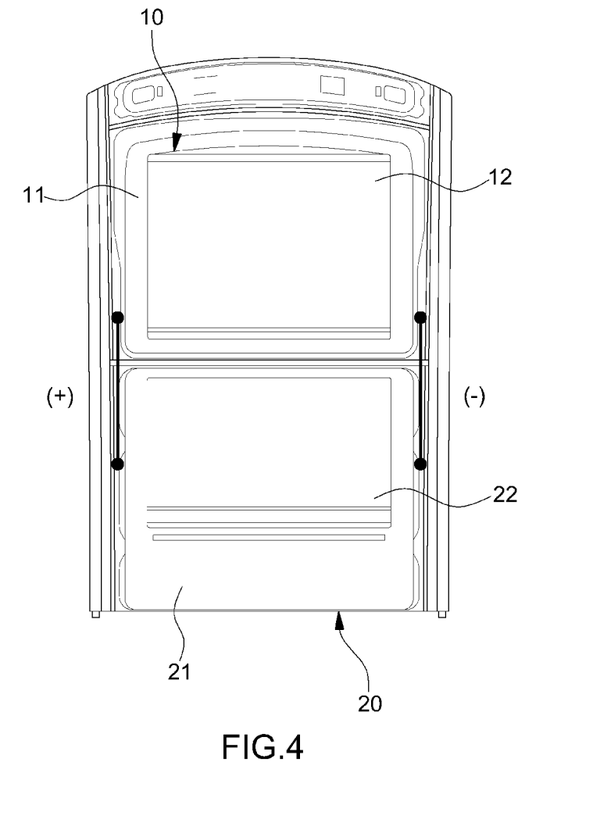
FIG. 4 is a plan view illustrating a state in which a (+) side electric wire and a (−) side electric wire are deployed at a left end and a right end of a roof between the movable part and a fixed part in an exemplary embodiment of the present invention.
Figure 5:
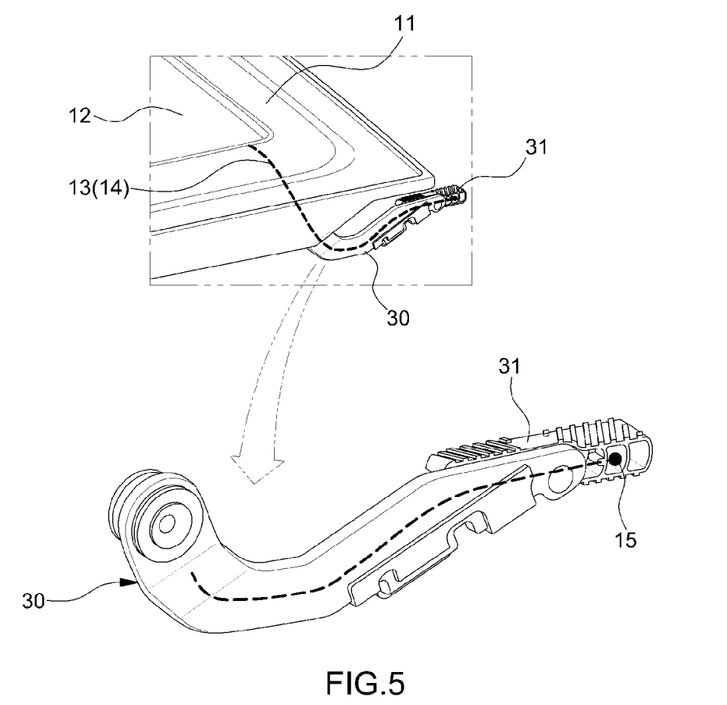
FIG. 5 is a perspective view illustrating a state in which a tilt lever is joined to the movable part in the exemplary embodiment of the present invention.

FIG. 4 is a plan view illustrating an exemplary embodiment in which a state in which a (+) side electric wire and a (−) side electric wire are deployed at a left end and a right end of a roof between the movable part 10 and the fixed part 20. FIG. 5 is a perspective view illustrating a state in which the tilt lever 30 is joined to the movable part 10.

As illustrated in FIG. 4, one electric wire between the movable part 10 and the fixed part 20 may be deployed at each of the left end and the right end of the roof by separating the (+) side and the (−) side.

Referring to FIG. 5, in certain embodiments, the tilt lever 30 is mounted at each of both left and right ends of the movable part 10 and each tilt lever 30 is installed in a structure to connect and support the movable part 10 in the fixed part 20.

As described above, one end of the tilt lever 30 is rotatably hinge-joined to the movable part 10 and the other end of the tilt lever 30 is inserted into the guide rail 41 to be guided through the contact slide member 31.

Referring to FIG. 5, in certain embodiments, the first electric wires 13 and 14 that extend from the solar cell module 12 of the movable part 10, are connected to the tilt lever 30 along the inside of the roof glass 11 (moving glass) and the first electric wires 13 and 14 extend to the contact slide member 31 part which is a part contacting the guide rail 41 in the tilt lever 30 and ends of the electric cables are buried in the contact part.

In certain embodiments, a conductive material is attached, coated, or buried in the portion in which the ends of the electric wires are buried, in the contact slide member 31 so as to be electrically connected with core wires of the electric wires to form a contact terminal 15.

In the exemplary embodiment of FIGS. 4 and 5, since the first electric wires, that is, one (+)-side electric cable and one (−)-side electric cable extend to both left and right ends of the roof, the (+)-side electric cable or the (−)-side electric cable is buried in one tilt lever 30.

Figure 6:
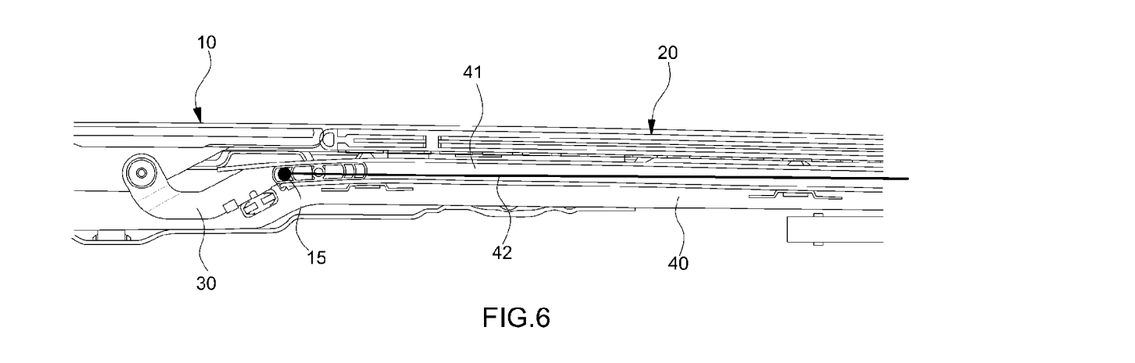
FIG. 6 is a side view illustrating a joining state of the movable part, the tilt lever, and a guide rail in the exemplary embodiment of the present invention.

FIG. 6 is a side view illustrating a joining state of the movable part 10, the tilt lever 30, and the guide rail 41 while the panorama roof is closed. In this embodiment, the contact slide member 31 joined to the tilt lever 30 is inserted and joined into the inside of the guide rail 41.

The portion in which the ends of the electric cables of the movable part 10 are buried, in the tilt lever 30 and the contact terminal 15 formed at the portion continuously maintain the normal contact state with one side of the guide rail 41 regardless of the location of the movable part 10.

In certain embodiments, second electric wires 42 and 43 are formed by attaching, coating, burying the conductive material are formed along the portion on the guide rail 41 which normally contacts the contact terminal 15 of the contact slide member regardless of the location of the movable part 10.

Herein, the second electric wires 42 and 43 of the guide rail 41 may be connected to the other electric wires 23 and 24 that extend from the solar cell module 22 of the fixed part 20 or connected to the battery in the vehicle or the in-vehicle apparatus using the power of the solar cell through a separate electric cable.

In certain embodiments, the second electric wires 42 and 43 of the guide rail 41 are fabricated in tape, film electric cable, and paste forms by mixing metal such as iron (Fe), gold (Au), silver (Ag), aluminum (Al), copper (Cu), tin (Sn), and platinum (Pt), conductive polymers such as polyaniline, polypyrrole, polythiopene, polyacetylene, and PEDOT(poly (3,4-ethylenedioxythiophene))-PSS(polystyrene sulfonate), carbon series conductive materials such as carbon nano tube (CNT), graphene, and carbon black, and one kind or two kinds or more of oxide series compounds such as ITO, FTO, ZnO, and AZO and thereafter, formed by the attachment, coating, or burying method.

When outside moisture or water flows in the guide rail 41 while the roof is opened, an electric shock accident may occur, and as a result, in certain embodiments, a rail cover 44 made of non-conductor materials such as lignum series, plastic series, cement series, SiO2 series, synthetic fiber, cotton fiber, rubber, urethane series, and the like are attached onto the electric wire 42 made of the conductive material in order to prevent the electric shock accident.

In this case, a part of the second electric wire 42 (or 43) may be exposed on the surface of the rail cover 44 so that the contact terminal 15 of the contact slide member 31 is electrically connected.

Consequently, when the movable part 10 stops or moves, the contact slide member 31 of the tilt lever 30 maintains the normal contact state at one side of the guide rail 41 and in particular, the contact terminal 15 of the contact slide member 31 maintains the normal contact state with the electric wire 42 of the guide rail 41.

Figure 7:
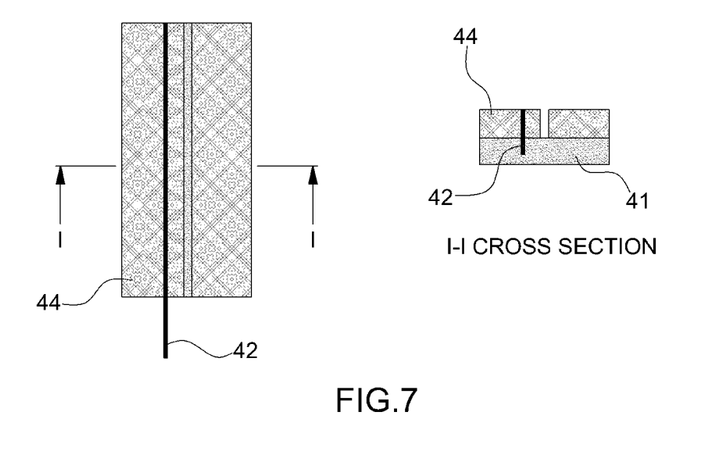
FIG. 7 is a diagram illustrating a state in which an electric wire is installed on the guide rail in the exemplary embodiment of the present invention.

FIG. 7 is a diagram illustrating a state in which the electric wire 42 (one of the second electric wires) is installed in the guide rail 41. The electric wire 42 is installed on the guide rail 41 that normally contacts the contact slide member 31 and in this case, the electric wire 42 is insulated by the rail cover 44 made of the non-conductor material such as rubber.

Figure 8:
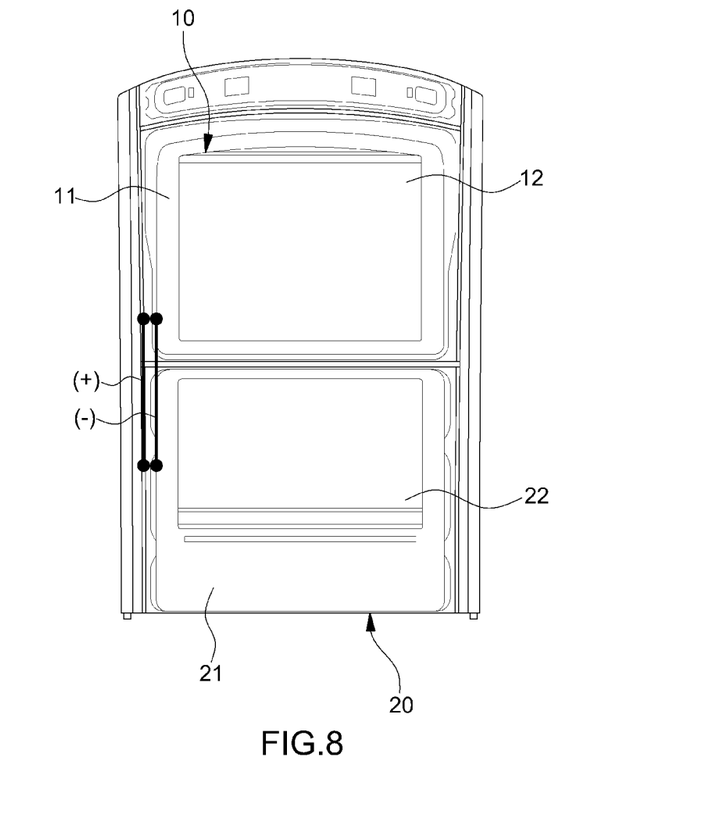
FIG. 8 is a plan view illustrating a state in which both the (+) side electric wire and the (−) side electric wire are deployed at one end of the roof between the movable part and the fixed part in another exemplary embodiment of the present invention.
Figure 9:
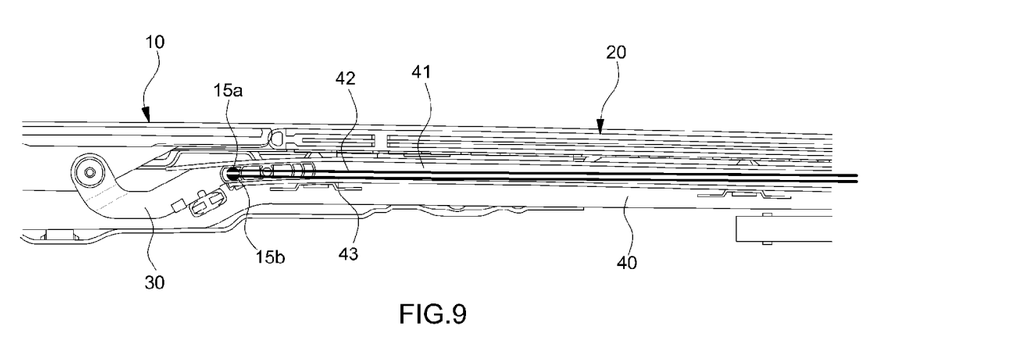
FIG. 9 is a side view illustrating a joining state of the movable part, the tilt lever, and the guide rail in another exemplary embodiment of the present invention.
Figure 10:
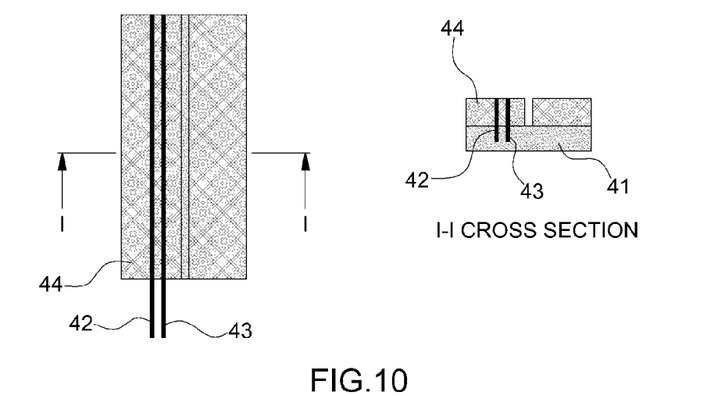
FIG. 10 is a diagram illustrating a state in which the electric wire is installed on the guide rail in another exemplary embodiment of the present invention.

FIGS. 8 to 10 are diagrams illustrating another embodiment of the present invention. FIG. 8 is a plan view illustrating a state in which both the (+) side electric wire and the (−) side electric wire are deployed at one end of the roof between the movable part 10 and the fixed part 20.

As illustrated in FIG. 8, in this embodiment, all electric wires connected between the movable part 10 and the fixed part 20 may be deployed at one end of the roof.

In this case, unlike the exemplary embodiment of FIGS. 4 to 7, both the (+) side electric cable and the (−) side electric cable of the movable part 10 extend to one tilt lever 30 and while the ends of both electric cables are buried in one contact slide member 31, a (+) side contact terminal 15*a* and a (−) side contact terminal 15*b* are separated at the buried portion.

Of course, both the (+) side contact terminal 15*a* and the (−) side contact terminal 15*b* are formed at the normal contact portion with the guide rail 41 in the contact slide member 31.

As illustrated in FIG. 9, the second electric wires 42 and 43 are formed on the guide rail 41 similarly to the exemplary embodiment of FIGS. 4 to 7, however, one (+) electric wire 42 and the (−) side electric wire 43 are formed along one guide rail 41 in line.

Referring to FIG. 10, in certain embodiments, two second electric wires 42 and 43 may be deployed in line and the second electric wires 42 and 43 are covered with the rail cover 44 to be insulated and in this case, at least a part of the second electric wires 42 and 43 is exposed on the surface of the rail cover 44 so as to contact the contact terminal 15 of the contact slide member 31.

As described above, in embodiments of the present invention, the solar cell applied to the movable part 10 through the guide rail 41 fixedly installed in the roof frame 40 and the tilt lever 30 that maintains the normal contact state with the guide rail 41 while moving along the guide rail 41 may in the normal connection state with the fixed part 20 of the vehicle regardless of the movement.

Therefore, in certain embodiments, the solar cell can be applied to the movable part 10 as well as the fixed part 20 of the vehicle roof, and as a result, a solar cell application portion can be enlarged to maximize solar cell utilization in the vehicle and power of the solar cell can be variously used in the vehicle to contribute to improve a driving distance of and fuel efficiency of the vehicle.

Embodiments of the invention have been described in detail. However, it will be appreciated by those skilled in the art that changes may be made in these embodiments without departing from the principles and spirit of the invention, the scope of which is defined in the appended claims and their equivalents.

What is claimed is:

1. An electric interconnection system in a vehicle, the system comprising:
   a fixed part of the vehicle;
   a movable part of the vehicle, the movable part comprising a solar cell module mounted thereon and at least one component that maintains contact with the fixed part when the moving part moves;
   one or more first electric wires extending from the solar cell module of the movable part, each of the one or more first electric wires having an end that is fixed to one of the at least one component of the movable part; and
   one or more second electric wires installed on the fixed part, the second electric wires maintaining contact with the ends of the first electric wires when the movable part moves,
   wherein the at least one component of the movable part is at least one tilt lever that is configured to tilt when the movable part moves, the fixed part is at least one guide rail slidingly joined with the at least one tilt lever and
   wherein each of the at least one tilt lever has one end rotatably joined to the movable part and another end inserted into one of the at least one the guide rail, the other end having a contact slide member disposed thereon and configured to be guided along the one of the guide rail, and one of the ends of the first electric wires is fixed to the contact slide member.

2. The system of claim 1, wherein the movable part is a part of a vehicle roof and is configured to open and close the roof.

3. The system of claim 2, wherein the vehicle roof is a panorama roof in which a solar cell module is bonded to a roof glass of the fixed part.

4. The system of claim 3, wherein when the vehicle roof is opened, the solar cell module mounted on the movable part is adjacent the roof glass of the fixed part which overlaps with the movable part.

5. The system of claim 3, wherein the solar cell module is bonded to the inside of the roof glass of the fixed part.

6. The system of claim 1, wherein the ends of the first electric wires are buried in the contact slide member and a conductive material is attached to, coated on, or buried in a buried portion of the ends of the first electric wires to form a contact terminal that is configured to connect to the second electric wires of the guide rail.

7. The system of claim 1, wherein the second electric wires are formed by attaching, coating, or burying a conductive material along the guide rail.

8. The system of claim 1, wherein the second electric wires comprise a conductive material in the form of a tape, a film, an electric cable, or a paste, and are formed by attaching, coating, or burying a conductive material along the fixed part.

9. The system of claim 8, wherein the conductive material includes at least one of the following: metal such as iron (Fe), gold (Au), silver (Ag), aluminum (Al), copper (Cu), tin (Sn), or platinum (Pt), conductive polymers such as polyaniline, polypyrrole, polythiopene, polyacetylene, or PEDOT (poly(3,4-ethylenedioxythiophene))-PSS(polystyrene sulfonate), carbon series conductive materials such as carbon nano tube (CNT), graphene, or carbon black, and one kind or two kinds or more of oxide series compounds such as ITO, FTO, ZnO, and AZO.

10. The system of claim 1, wherein a rail cover made of an electric insulating material is attached to the second electric wires and a portion of the second electric wires is exposed on the surface of the rail cover so that the ends of the first electric wires are electrically connected to the second electric wires.

11. The system of claim 1, wherein the one or more first electric wires include one (+) side electric wire and one (−) side electric wire that are each fixed to one of the at least one tilt lever and are each positioned at one of left and right sides of the vehicle, the one or more guide rails include left and right guide rails at left and right sides of the vehicle, respectively, wherein each tilt lever is slidingly joined with one of the left and right guide rails.

12. The system of claim 1, wherein the one or more first electric wires include a (+) side electric wire and a (−) side electric wire that extend to one of the at least one tilt lever,
the one or more second electric wires include a (+) side electric wire and a (−) side electric wire installed on one of the at least one guide rail, and
the ends of the a (+) side electric wire and a (−) side electric wire of the first electric wires are respectively connected with the (+) side electric wire and the (−) side electric wire of the second electric wires installed in the one of the at least one guide rail.

13. The system of claim 1, further comprising a second solar cell module mounted on the fixed part.

* * * * *